United States Patent [19]
Hushek

[11] Patent Number: 5,749,834
[45] Date of Patent: May 12, 1998

[54] INTERSECTING MULTISLICE MRI DATA ACQUISTION METHOD

[75] Inventor: Stephen G. Hushek, Brookfield, Wis.

[73] Assignee: General Electric Company, Waukesha, Wis.

[21] Appl. No.: 777,494

[22] Filed: Dec. 30, 1996

[51] Int. Cl.⁶ .................................................. A61B 5/055
[52] U.S. Cl. ........................................ 600/410; 324/309
[58] Field of Search ........................... 600/410; 324/307, 324/309

[56] References Cited

U.S. PATENT DOCUMENTS

| | | | |
|---|---|---|---|
| 4,707,658 | 11/1987 | Frahm et al. | 324/309 |
| 4,847,560 | 7/1989 | Sattin | 324/309 |
| 5,222,500 | 6/1993 | Sugimoto | 128/653.2 |
| 5,237,273 | 8/1993 | Plewes et al. | 324/309 |
| 5,241,271 | 8/1993 | Taguchi et al. | 324/309 |
| 5,270,654 | 12/1993 | Feinberg et al. | 324/309 |
| 5,345,172 | 9/1994 | Taguchi et al. | 324/309 |
| 5,406,203 | 4/1995 | Oh et al. | 324/309 |
| 5,501,218 | 3/1996 | Usui . | |
| 5,548,216 | 8/1996 | Dumoulin et al. | 324/309 |
| 5,578,924 | 11/1996 | Dumoulin et al. | 324/309 |
| 5,615,676 | 4/1997 | Kohno | 128/653.2 |

Primary Examiner—Marvin M. Lateef
Assistant Examiner—Shawna J. Shaw
Attorney, Agent, or Firm—Quarles & Brady

[57] ABSTRACT

In an MRI system a scan is performed to acquire data from which multiple intersecting slice images are reconstructed. During each pulse sequence, the slices are separately and selectively excited to produce transverse magnetization, and this magnetization is collectively refocused by a single non-selective refocusing pulse which produces an echo signal for each slice image. The flip angles of the excitation pulses are chosen to eliminate saturation lines at the slice intersections.

4 Claims, 2 Drawing Sheets

INTERSECTING MULTISLICE MRI DATA ACQUISTION METHOD

BACKGROUND OF THE INVENTION

The field of the invention is nuclear magnetic resonance imaging methods and systems. More particularly, the invention relates to the acquisition of MRI data from multiple intersecting slices.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Magnetic resonance guided therapy employs MR imaging to assist in the application of therapeutic energy to tissues. Such methods are described, for example, in U.S. Pat. Nos. 5,526,814 and 5,443,068. In addition to the need for rapid, nearly real time production of images, this use of MRI requires visualization of the maximum amount of tissues in the affected volume. Single slice, rapid acquisition methods do not provide information on tissue outside the slice. This is detrimental to effective therapy control because the energy, whether from lasers, focussed ultrasound or cryotherapy, spreads through the tissues in a three-dimensional pattern. The spread of the energy is determined by the energy absorption profile and the dynamic thermal properties of the tissue. All the relevant parameters are heterogeneous and these parameters will change during the course of the therapy. Thus, to maximize the efficacy of the treatment and optimize patient safety, visualization of as much of the energy distribution in the tissues as possible is desired. However, increased coverage at the cost of significant decreased temporal resolution is not acceptable in this application where the visual information must be provided on a near real time basis.

In the past, multislice orthogonal images have been collected by changing the slice select, phase encode, and read gradients for each measurement pulse sequence. However, the spins which are in two or more of the slices are subject to the RF excitation pulse for both slices, and this results in saturation at the slice intersection. The resultant images have saturation bands, normally black, along the area in which that image slice intersects one or more of the other image slices.

One technique for eliminating the saturation bands is to select slices which intersect outside of the region of interest. This enables two or more non-parallel slices to be imaged concurrently. However, the requirement that the slices intersect outside of the region of interest greatly limit the planes which may be selected.

SUMMARY OF THE INVENTION

The present invention relates to a method for operating an MRI system in order to rapidly acquire NMR data from a region of interest and reconstruct a plurality of slice images that intersect within the region of interest. More specifically, multiple intersecting slices through the region of interest are sequentially excited with selective RF excitation pulses each having a flip angle less than 90°, a non-selective RF refocusing pulse is applied to refocus transverse magnetization in all of the intersecting slices, and NMR echo signals from successive slices are acquired in the inverse order in which they were excited. An element of this invention is the selection of flip angles for the RF excitation pulses such that the combined excitation combination at the lines of intersection of the slices produce substantially the same signal intensities that are produced in non-intersecting regions of the slices.

A general object of the invention is to acquire NMR data for multiple, intersecting slices without substantially increasing scan time. Multiple spin echo signals are acquired in each pulse sequence by selectively exciting each intersecting slice and then non-selectively refocusing their transverse magnetization.

Another object of the invention is to produce images in which the saturation lines at the intersection of slices are minimized. By properly selecting the flip angles for each RF excitation pulse, the saturation lines can be eliminated. For example, the use of 60 degree RF excitation pulses for two intersecting planes produces a composite flip angle in the line of intersection of 120 degrees. This produces substantially the same signal as a 60 degree flip angle because the signal intensity is proportional to the sine of the flip angle and sin 60°=sin 120°. Thus, the line of intersection is iso-intense with the remainder of the slice, nullifying the main objection to simultaneous excitation of intersecting slices. The principle can be extended to excitation of three orthogonal slices, at the cost of a central signal void at the intersection point of all three planes where the excitation pulses combine to produce a flip angle of 180 degrees.

DESCRIPTION OF THE PREFERRED EMBODIMENT

Figure 1:
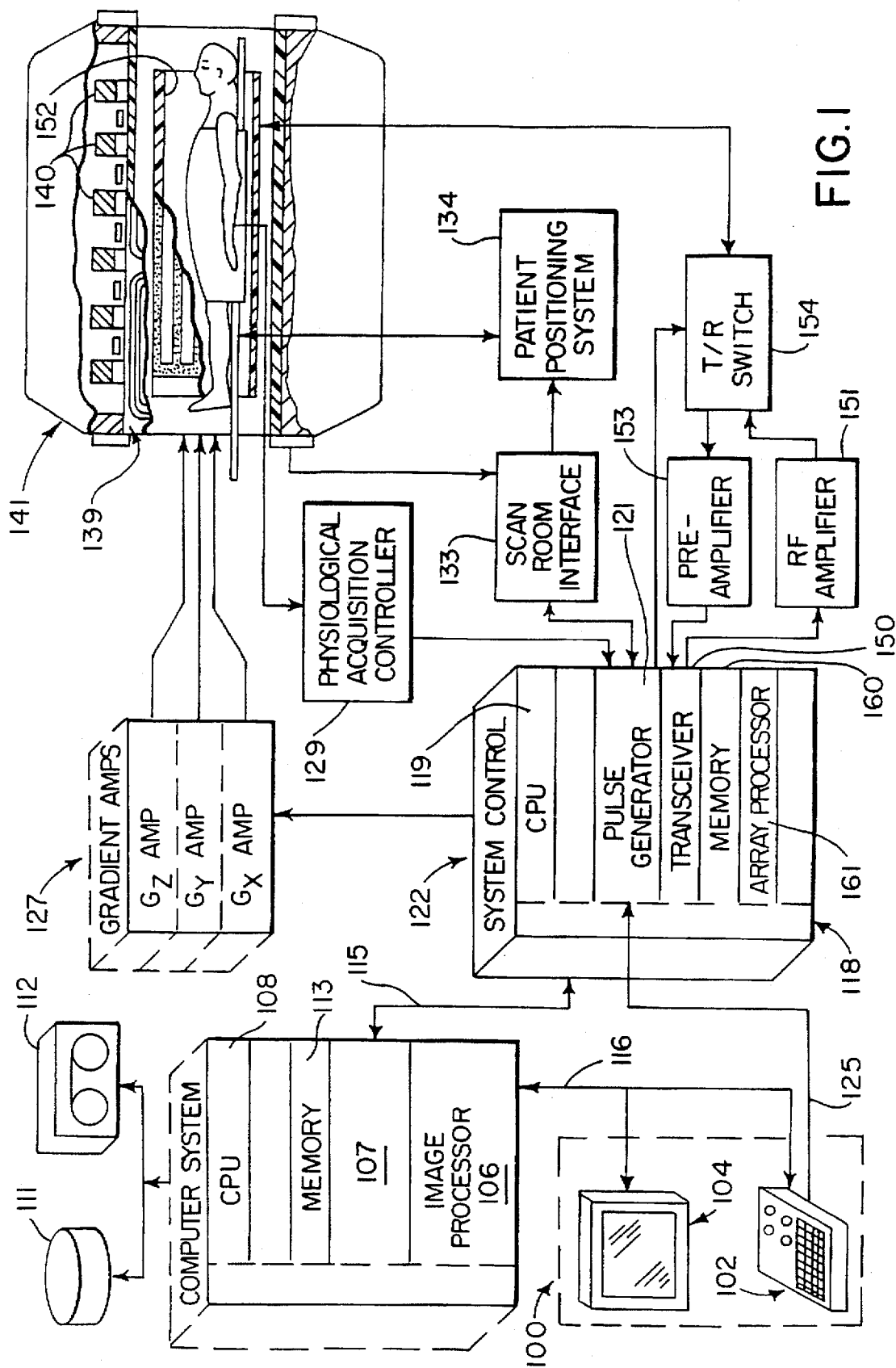
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the scan sequence in accordance with the present invention. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. The pulse generator module 121 connects to a scan room interface circuit 133 which receives signals from the therapeutic device (not shown) being used to treat the patient. These signals synchronize the acquisition of NMR image data with the treatment procedure being used. It is also through the scan room interface circuit 133 that a patient positioning system 134 receives commands to move the patient to the desired position.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
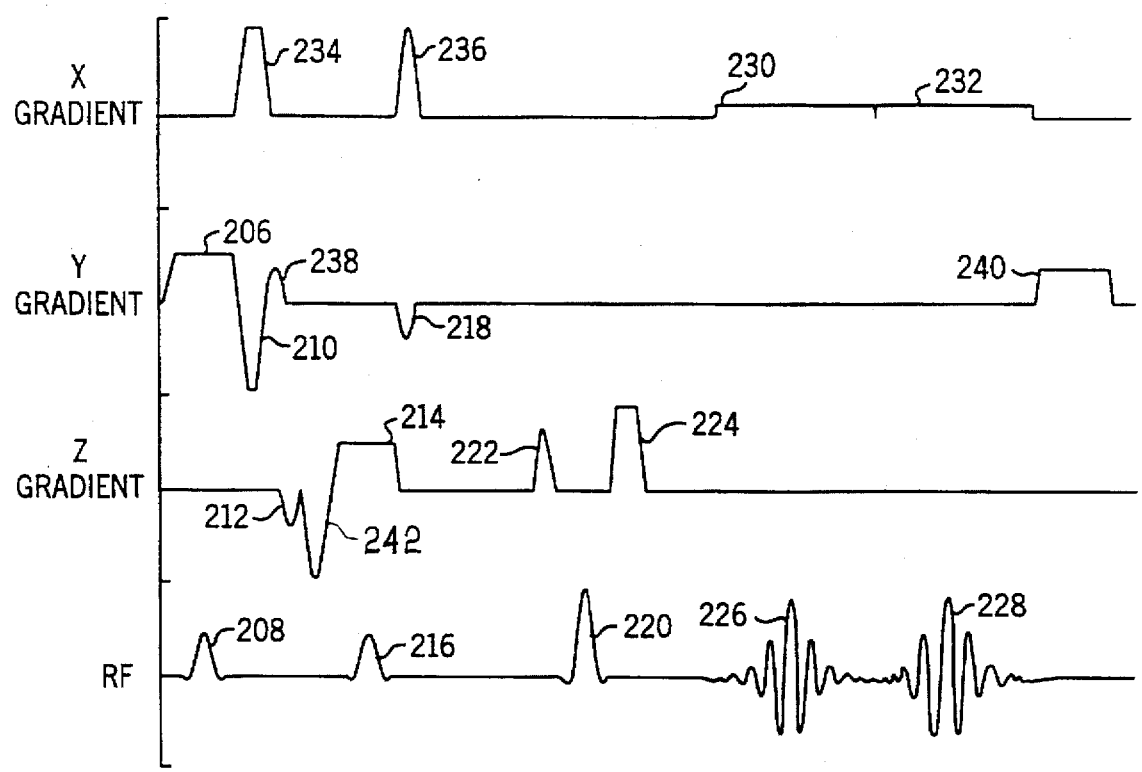
FIG. 2 is a graphic representation of a preferred pulse sequence performed by the MRI system of FIG. 1 to practice the present invention.
Figure 3:
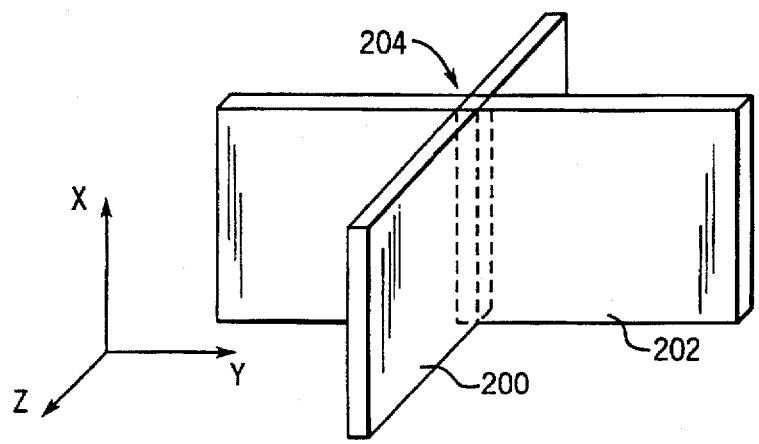
FIG. 3 is a pictorial representation of two intersecting slices

A preferred embodiment of a pulse sequence according to the present invention is illustrated in FIG. 2. A scan performed using this pulse sequence acquires NMR data from which two images depicting spins in two perpendicular slices may be reconstructed. These slices are illustrated in FIG. 3, where a first slice 200 is disposed in an x-z plane and a second slice 202 is disposed in an x-y plane. The two slices 200 and 202 intersect at 204, and it is a teaching of the present invention that this intersection 204 may be made iso intense in the reconstructed images by a proper selection of flip angles used in the pulse sequence of FIG. 2.

Referring particularly to FIG. 2, the pulse sequence separately excites the spins in the respective slices 200 and 202. A first slice select gradient pulse 206 is produced by the $G_y$ gradient and a selective rf excitation pulse 208 is applied to produce transverse magnetization in the first slice 200. As is known in the art, the frequency and bandwidth of the rf pulse 208 is selected to properly locate the slice 200 along the y axis and to excite the desired slice thickness. It is a teaching of the present invention that the flip-angle of the rf pulse 208 is chosen to maintain the intersection 204 iso-intense, and in this embodiment of the invention the flip-angle is set to 60°. The spins are then re-phased in conventional manner by a re-phasing gradient pulse 210 and the transverse magnetization in slice 200 is phase encoded by a gradient pulse 212 produced by the $G_z$ gradient. As is well known in the art, the phase encoding pulse 212 is stepped through a series of values during the scan to sample k-space along the z axis.

The second slice 202 is then excited by applying a second slice select gradient pulse 214 produced by the $G_z$ gradient. A second rf excitation pulse 216 is applied simultaneously, and its frequency and bandwidth are chosen to select the slice 202 at the desired location along the z axis, and of the proper thickness. The flip-angle of the second rf excitation pulse 216 is also 60°, and as a result, the spins at the intersection 204 of the two slices 200 and 202 are permutated by a total of 120°. This produces an NMR signal of the same intensity as the 60° flip-angle. The transverse magnetization in the second slice 202 is then phase encoded by a gradient pulse 218 produced by the $G_y$ gradient.

The phase of the spin precession in both slices 200 and 202 is refocused by a non-selective rf refocusing pulse 220. This refocusing pulse 220 is preceded and followed by crusher gradient pulses 222 and 224. The crusher gradient pulse 224 dephases the free induction decay that occurs after the RF pulse 220. The crusher gradient pulse 222 balances the crusher 224 and maintains phase coherency in the slice. The crusher gradient pulse 22 includes the negative rephasing pulse that normally follows the slice select gradient pulse 214. The rf refocusing pulse 220 is non-selective and it thus refocuses spin phase in both of the slices 200 and 202.

As a result, spins in the second slice 202 refocus and produce a first echo signal 226 and the spins in the first slice 200 refocus and produce a second echo signal 228. The first echo signal 226 is acquired in the presence of a readout gradient pulse 230 produced by the $G_x$ gradient, and the second echo signal 228 is acquired in the presence of a second readout gradient pulse 232, also produced by the $G_x$ gradient. A dephasing gradient pulse 234 is produced using the $G_x$ gradient to properly sample k-space along the x axis during the readout of NMR data for the first slice 200, and a second dephasing gradient pulse 236 is produced using the $G_x$ gradient to properly sample k-space along the x-axis during the readout of NMR data for the second slice 202. The dephasing gradient pulse 236 is one-half the size of the gradient pulse 234 and it is one-half the size of the readout gradient pulses 230 and 232.

The $G_y$ gradient pulse 238 is the same size as the phase encoding pulse 218, and it serves to "rewind", or rephase spin magnetization as described in U.S. Pat. No. 4,665,365. The $G_y$ gradient pulse 240 dephases or "kills" any net transverse magnetization that remains after the readout of the second echo signal 228. The $G_z$ gradient pulse 242 is equal to one-half the slice select $G_z$ pulse 214 that follows, and it maintains phase coherence in slice 200 so that all the $G_z$ gradient pulses are canceled for slice 200 except for the phase encoding gradient pulse 212.

It will be appreciated by those skilled in the art that by locating the intersection 204 of the two slices 200 and 202 at the target of the therapeutic procedure, the results of the therapy can be monitored in two planes. Additional information is thus provided with virtually no reduction in temporal resolution, although there is a slight reduction in the signal-to-noise ratio (SNR) of the images due to the lower flip-angles that are used.

It can also be appreciated that variations in the preferred embodiment are possible without departing from the spirit of the invention. For example, a third intersecting slice can also be monitored. In such case a $G_x$ slice select gradient pulse would be employed along with a third selective, 60° rf excitation pulse. The three resulting images are iso-intense except at the single location where all three slices intersect. At this location the spins are tipped by 180° to produce a void in the image.

I claim:

1. A method for producing multiple slice images with an MRI system depicting a subject in multiple planes that intersect within a region of interest, the steps comprising:

a) producing a series of slice select magnetic field gradient pulses corresponding to the multiple planes;

b) producing concurrently with the slice select magnetic field gradient pulses a corresponding series of selective RF excitation pulses which produce transverse magnetization in each of said multiple planes;

c) producing phase encoding magnetic field gradient pulses for each of said multiple planes;

d) producing an RF refocusing pulse which refocuses the transverse magnetization in all of said multiple planes at a series of echo signal times;

e) producing a readout magnetic field gradient pulse at each of said echo signal times;

f) acquiring an echo signal for each of said multiple planes;

g) repeating steps a) through f) until echo signals are acquired for a preselected number of different phase encodings; and h) reconstructing a slice image for each of said multiple planes using the corresponding acquired echo signals; and wherein the flip angles of the RF excitation pulses are chosen such that the echo signal intensity at the intersections of said multiple planes is a preselected level relative to the echo signal intensity throughout the multiple planes.

2. The method as recited in claim 1 in which the flip angles of the RF excitation pulses are chosen such that the echo signal intensity at the intersections of said multiple planes is substantially the same as the echo signal intensity throughout the multiple planes.

3. The method as recited in claim 2 in which there are two intersecting planes and the RF excitation pulse for each of said two intersecting planes has a flip angle of substantially 60°.

4. The method as recited in claim 2 in which there are three intersecting planes and the RF excitation pulse for each of said three intersecting planes has a flip angle of substantially 60°.

* * * * *